(12) United States Patent
Campbell

(10) Patent No.: US 8,908,368 B2
(45) Date of Patent: Dec. 9, 2014

(54) RACK LEVEL HOT AISLE CONTAINMENT SYSTEM

(75) Inventor: Joseph Kyle Campbell, Miami, FL (US)

(73) Assignee: Verizon Patent and Licensing Inc., Basking Ridge, NJ (US)

( * ) Notice: Subject to any disclaimer, the term of this patent is extended or adjusted under 35 U.S.C. 154(b) by 200 days.

(21) Appl. No.: 13/345,845

(22) Filed: Jan. 9, 2012

(65) Prior Publication Data

US 2013/0176678 A1 Jul. 11, 2013

(51) Int. Cl.
*H05K 7/20* (2006.01)
*H05K 5/00* (2006.01)

(52) U.S. Cl.
USPC ...... 361/679.46; 361/687; 361/691; 361/695; 454/184

(58) Field of Classification Search
USPC .............. 361/687, 679.46, 691, 695; 454/184
See application file for complete search history.

(56) References Cited

U.S. PATENT DOCUMENTS

| | | | |
|---|---|---|---|
| 7,255,640 B2 * | 8/2007 | Aldag et al. | 454/184 |
| 7,604,535 B2 * | 10/2009 | Germagian et al. | 454/184 |
| 7,752,858 B2 * | 7/2010 | Johnson et al. | 62/186 |

* cited by examiner

*Primary Examiner* — Anthony Haughton
*Assistant Examiner* — Zhengfu Feng

(57) ABSTRACT

A method and system of cooling a server rack unit is described herein. A server rack for housing certain devices may be configured to receive a first air flow at a server rack front. Each device may form a wall at the back of the device creating a channel between the wall and the server rack back. The camber may collect warm air created by the first air flow as it extends over the at least one server. A first surface of the server may define at least one server rack opening allowing the warm air in the channel to exit the server rack.

13 Claims, 4 Drawing Sheets

RACK LEVEL HOT AISLE CONTAINMENT SYSTEM

BACKGROUND INFORMATION

Cooling units, such as computer room air coolers (CRACs) and computer room air handlers (CRAHs), deliver cool air to large scale electronic components and equipment, such as computer servers. Generally, the electronic equipment is housed in a room and warm air from the electronic equipment is discharged into the room. This warm air is then cooled by the cooling unit and redelivered to the electronic equipment for cooling the equipment. However, there is a need for more efficient cooling systems.

BRIEF DESCRIPTION OF THE DRAWINGS

While the claims are not limited to the illustrated examples, an appreciation of various aspects is best gained through a discussion of various examples thereof. Referring now to the drawings, illustrative examples are shown in detail. Although the drawings represent the various examples, the drawings are not necessarily to scale and certain features may be exaggerated to better illustrate and explain an innovative aspect of an example. Further, the examples described herein are not intended to be exhaustive or otherwise limiting or restricting to the precise form and configuration shown in the drawings and disclosed in the following detailed description. Exemplary illustrations of the present invention are described in detail by referring to the drawings as follows.

DETAILED DESCRIPTION

Figure 1:
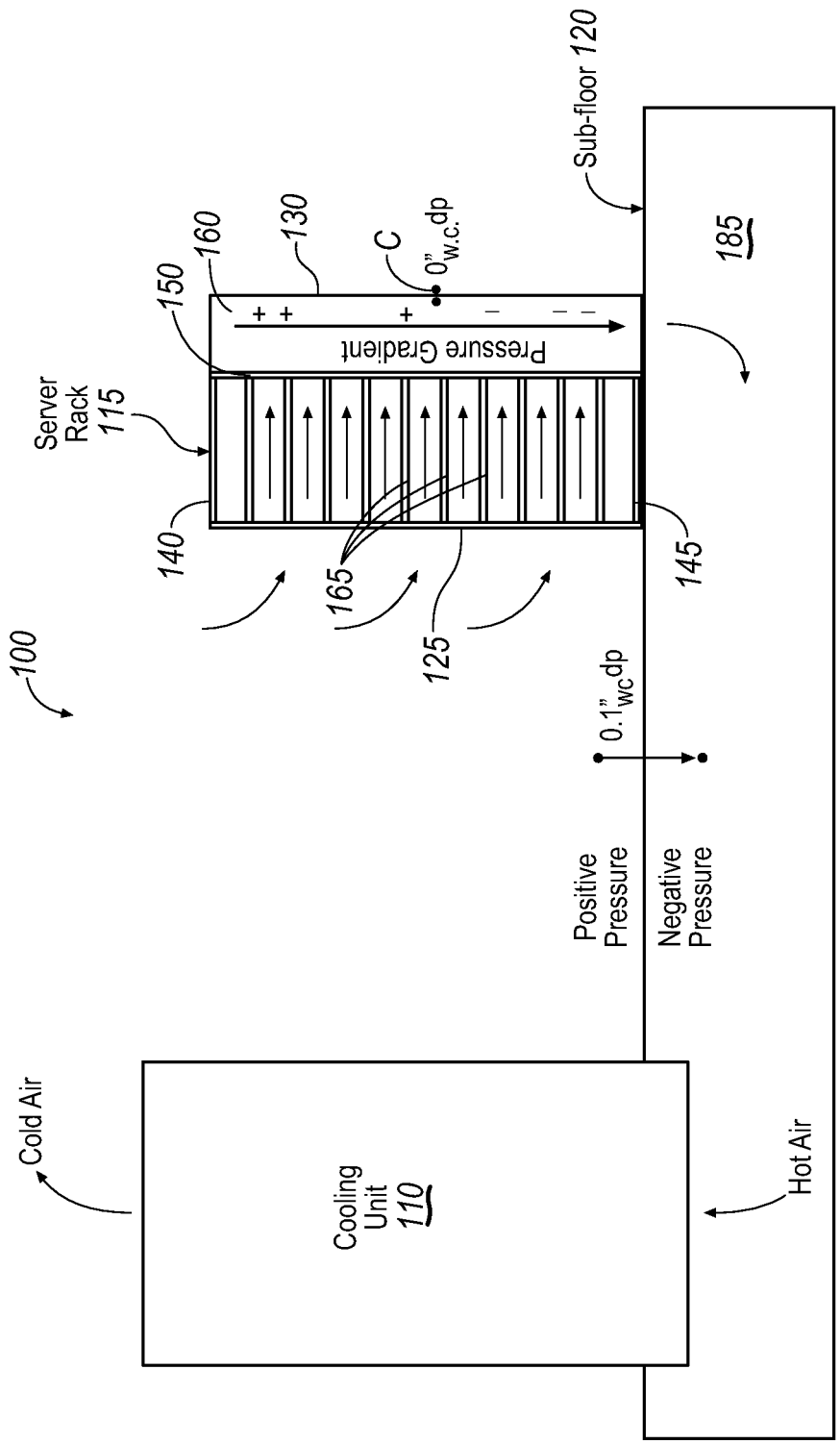
FIG. 1 is a side view of the system.

Referring now to the discussion that follows and also to the drawings, illustrative approaches to the disclosed apparatuses and methods are shown in detail. Although the drawings represent some possible approaches, the drawings are not necessarily to scale and certain features may be exaggerated, removed, or partially sectioned to better illustrate and explain the disclosed device. Further, the descriptions set forth herein are not intended to be exhaustive or otherwise limit or restrict the claims to the precise forms and configurations shown in the drawings and disclosed in the following detailed description.

An exemplary system for cooling at least one server within a server rack is described herein. The server rack may include a plurality of heat generating devices held in the server rack by a plurality of shelves. The server rack may be sealed at the sides with at least one side panel, as well as at the server rack back with a back panel, preventing any air from entering or leaving the server rack at the sides and back. In one example, several server racks may be placed next to each other in a row, whereby each server rack abuts the next. In this example, the side panels may be sealed to the outer sides of the first and last server racks in the row. Thus, side panels may not be disposed on each side that abuts the next rack.

The back of each of the devices (servers, routers, switches, etc.) may form a wall, or obstruction, between the front of the server rack and the back of the server rack, creating a channel between the back of the devices and the back of the server rack. The server rack front may receive cool air supplied by a cooling unit. The cool air may flow across each of the servers in the server rack towards the back of the servers to the wall. As the air flows across the servers, the servers are cooled and the air becomes warm. The warm air extends into the channel and is then funneled into a floor opening, and received at the cooling unit. The cooling unit, in turn, cools the warm air, and then presents the cool air at the server rack front.

Figure 2:
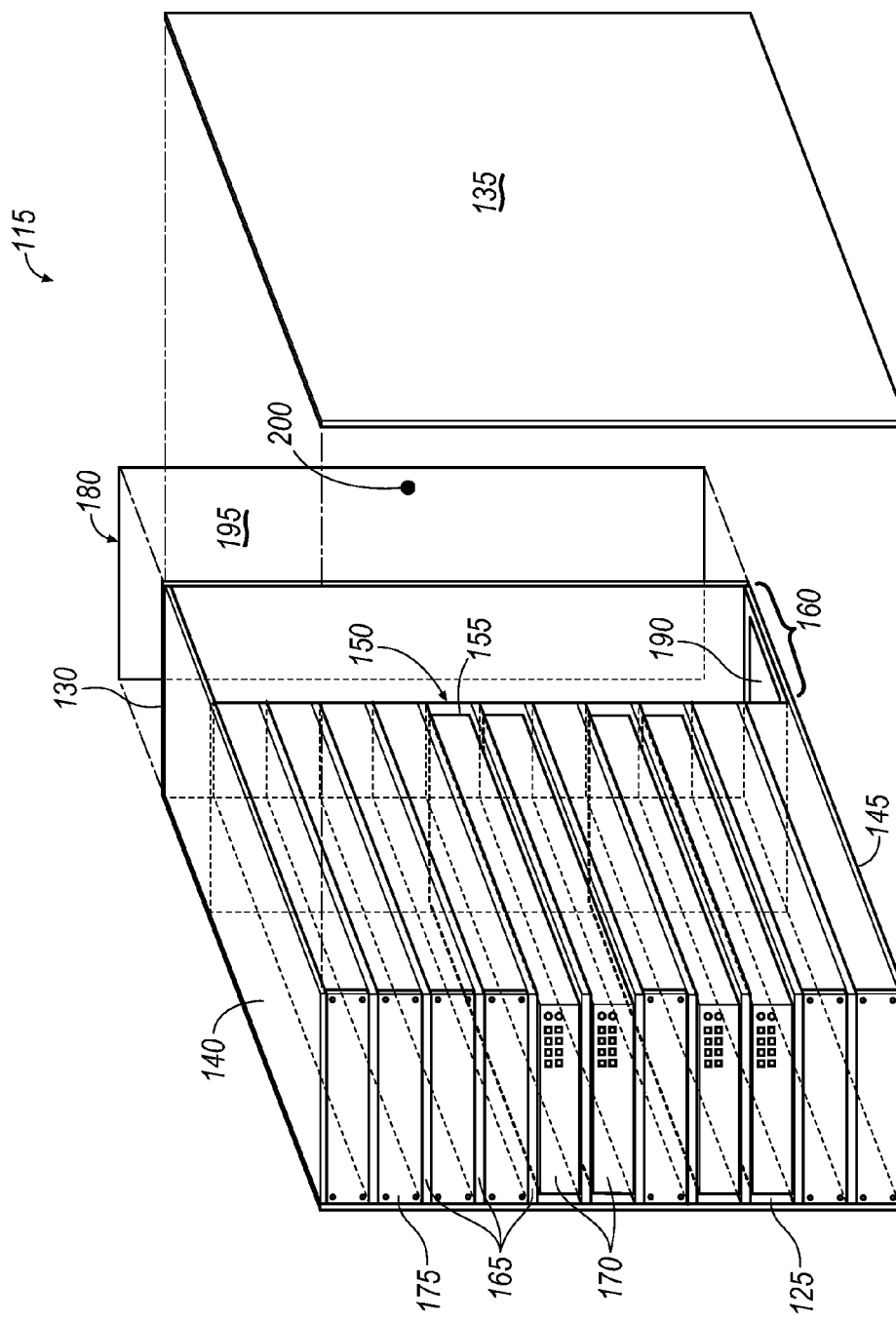
FIG. 2 is a perspective view of an exemplary server rack of the system.

Referring now to FIGS. 1 and 2, a system 100 includes a cooling unit 110 and a server rack 115 spaced from the cooling unit 110. The cooling unit 110 may be any one of a computer room air cooler (CRAC) or a computer room air handler (CRAH). CRACs and CRAHs may be one of a downflow unit, where warm air enters the cooling unit at the top of the unit 110 and cool air exits the unit 110 at the bottom of the unit, or an upflow unit, where warm air enters the cooling unit 110 at the bottom or side of the unit 110 and cool air exits at the top. The cooling unit 110 and server rack 115 may be located within a single room. Additionally or alternatively, the cooling unit 110 may be located outside of the room housing the server 115. The server rack 115 may be disposed on top of a server room sub-floor 120 and may include a server rack front 125 and a server rack back 130 connected by two sides. The server rack 115 also has first surface and a second surface extending perpendicular to each of the two sides. For illustrative purposes only, the first surface may be a server rack bottom 145 and the second side may be a server rack top 140. A wall 150, or obstruction, may be formed within the server rack 115 between the server rack front 125 and server rack back 130. The wall 150 may be formed by the backs 155 of the heat generating devices 170 and blanking panels 175 housed by the server rack 115. An exemplary back view of the server rack 115 may be seen in FIG. 3. A channel 160 is defined between the wall 150 and the server rack back 130. The server rack 115 may include a plurality of server shelves 165 extending generally parallel to the server bottom 145 and extending from the server rack front 125 to a bisecting point of the server rack 115, such as the wall 150. As illustrated a server rack top 140 may also be generally parallel to shelves 165 and bottom 145. The server shelves 165 are configured to hold at least one heat generating device 170, such as a computing switch, server, modem, etc. Each device 170 has a device front and a device back 155. The device front may align with the server rack 115 at the server rack front 125. The shelves 165 may be attached at the server rack sides. The shelves 165 may also be attached to a sliding mechanism (not shown) at the sides whereby each shelf 165 may slide in and out of the server rack 115. Where there is an empty shelf, a blanking panel 175 may be disposed on or within the empty shelf. These blanking panels 175 cover unused rack space so that the cool air entering at the server rack front 125 is directed toward and in proximity to heat generating devices 170, thereby improving the efficiency of the system.

Because some shelves 165 are empty, the wall 150 may not be continuous. As explained, the wall 150 is a location within the server rack 115. Specifically, the wall 150 may be located at a distal end of the shelves where air flowing across the servers extends into the channel. If a shelf 165 is empty, little to no air extends across it due to the blanking panel 170 disposed at the server rack front 125. However, as explained in more detail below, warm air extending across the devices 170 enters the channel 160 to be ducted out of the server rack 150 at the server bottom 145.

Figure 3:
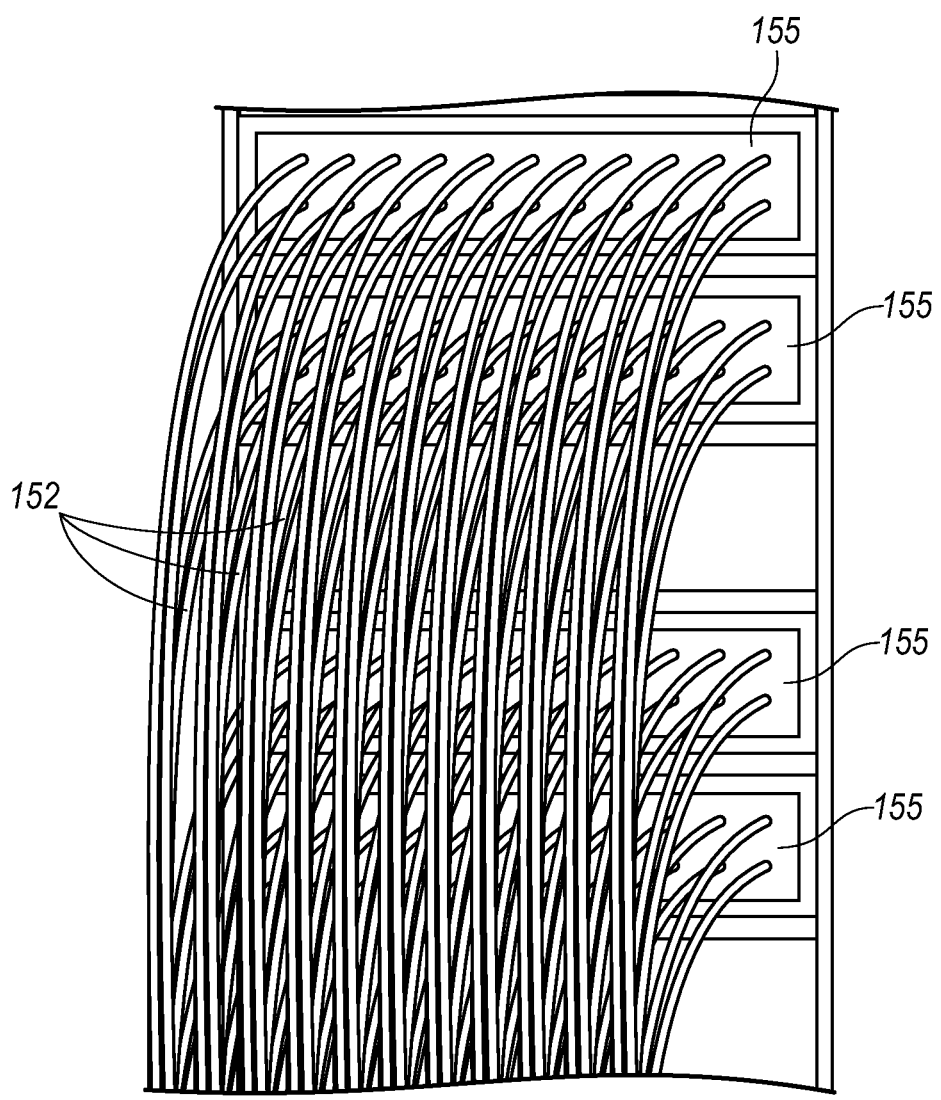
FIG. 3 is a back view of the exemplary server rack of FIG. 2.

Each of the heat generating devices 170 may have a plurality of media lines 152 extending therefrom, as shown in FIG. 3. These media lines 152 may include power supply lines and communication lines, as well as any number of coaxial and fiber optic cables. The server rack 115 may provide a cable run (not shown) at the rear of the shelves 165 so that the media lines 152 may be contained in an orderly fashion. The media lines 152 may extend through from the back of the heat generating device 170 to the channel 160. Additionally, the power supply lines may extend downward into the floor 120 while communication lines may extend upward through the server rack top 140 and/or vice versa. For example, the communication lines may extend through a grommet or ceiling plenum (not shown) at the top of the channel 160. The communication lines may extend into a cable conduit located above the server rack 115.

At least a portion of media lines 152 from the heat generating devices 170 may extend through the channel 160 and underneath the sub-floor 120 into a duct 185. The media lines 152 may be structured so that lines from each respective heat generating device 170 may be grouped together. By grouping the media lines 152 together, (e.g., via a tie, cable, etc.), the lines 152 may extend as a unitary line through the duct 185. This allows for a less obstructed air flow through the duct 185 so that the warm air from the channel 160 may more freely flow to the cooling unit. The duct 185 is described in more detail below.

Portions of the server rack 115 may be sealed so that air does not unintentionally escape or enter the server rack 115. For example, side panels 135 may be sealed to each of the two sides, closing off the two sides so that air may not flow in or out of the rack 115 at the sides. Thus, air may be directed from the server rack front 125 to the server rack back 130. The portion of the server bottom 145 extending between the server rack front and server wall 150 may also be sealed to the sub-floor 120. The sub-floor 120 beneath this portion may be a solid panel without any openings so that air cannot escape the duct 185 below this area. The server rack 115 may also be sealed around the bottom at the area below the channel 160 defining at least one server rack opening 190 to prevent any warm air in the channel 160 from escaping into the server room.

Similar to the side panels 135, a back panel 180 may also be sealed to the server rack back 130 to prevent any air from flowing through or out of the server rack back 130. The panels 135, 180 may be easily configured to attach to an existing rack 115. They may be any type of fire rated material. Corrugated materials such as corrugated metal may be used. The panels 135, 180 may also be sheet metal, sheet rock, glass, wood, particle board, Styrofoam®, or any other material capable of preventing air from passing therethrough. The back panel 180 may be added to an existing perforated panel already enclosing the server rack back 130.

The panels 135, 180 may be sealed along all edges of the server rack 115 to ensure that air cannot escape at the edges. For example, weather stripping may be adhered around the edges of the back panel at the inside of the server rack back-server rack back 130. Moreover, the panels 135, 180 may be soldered, brazed, welded, or tied to the server rack 115. Additionally or alternatively, the panels 135, 180 may be attached to the server rack 115 by a connecting mechanisms such as bolts, screws, clamps, adhesive, epoxy, etc.

The back panel 180 may include a server rack door 195. The server rack door 195 may be openable, providing access to the back of the server rack 115. The door 195 may be openable by a handle 200. The handle 200 may include a knob and latch. Additionally, the door handle 200 may include a lock for supplying additional security to the server rack 115. The door 195 may include a transparent panel such as glass, plastic, Plexiglas®, etc., allowing for visibility of the server rack 115. The door 195 may form a tight seal with the back panel 180 so that air cannot escape through the door 195.

At the server bottom 145, the server rack 115 may be sealed to a sub-floor 120 or raised floor plenum by any of the mechanisms described above with respect to the panels 135, 180. The sub-floor 120 may be disposed above the server room floor and include a plurality of floor tiles. In an exemplary arrangement, each floor file may be 2'×2'. The sub-floor 120 may create a duct 185 beneath the floor 120, extending between the walls of the room or a separate duct 185 may be utilized. The sub-floor 120 may define at least one floor opening 190 for receiving the warm air and the media lines 152 from the channel 160. In one example, the dimensions of the server rack opening 190 may be no larger than the dimensions of the channel 160. The opening 190 may be approximately 2' by 1'. The opening 190 may extend across the entire server bottom 145, but only the portion under the channel 160. Thus, in the given example, only a portion of a typical 2'×2' floor tile will define the at least one opening 190. In another example the opening may extend across the entire floor tile.

The floor opening 190 is open to the duct 185 disposed underneath the sub-floor 120 of the server room. The duct 185 extends from the bottom of the channel 160 at the floor opening 190 to the bottom of the cooling unit 110. The duct 185 is configured to receive warm air from the channel 160 and funnel it to the cooling unit so that it may be cooled. The duct 185 may be formed of metal, concrete, or any other suitable material. Additionally or alternatively, the duct 185 may be defined by the sub-floor 120 and walls of the server room and thus no additional part or material is necessary to form the duct 185. Moreover, due to the heat of the air received from the channel 160, the air pressure within the duct 185 may be lower than the air pressure above the sub-floor 120.

A fan and damper (not shown) may be disposed within the channel 160 to direct the warm air downward through the floor opening 190. The fan may include a plurality of fans disposed within the channel 160. For example, a pair of fans may be disposed at the server rack bottom 145 configured to blow the air downward through the channel 160. The damper may be placed in the vicinity of the floor opening 190. The damper may have the same dimensions as that of the opening 190 and the channel 160. The damper is configured to regulate the air flow of the warm air through the channel 160. The damper may be a manual damper or an automatic damper having an electric or pneumatic motor. The damper may be regulated based on the static differential pressure of the room with respect to the channel 160. The damper may also be regulated based on the temperature and air pressure in the channel 160. As indicated in FIG. 1, the pressure gradient may be zero forces per unit mass at the zero point C. The pressure gradient may be positive above a zero point C of the channel 160 and negative below the zero point C. The zero point C may be a center point of the channel 160, or any point along the channel 160. To maintain this zero gradient, the damper may be adjusted accordingly. A pressure sensor may be placed within the channel 160 to measure the pressure across the channel 160. If the pressure increases or decreases so as to prevent the zero point C from having a pressure gradient of zero, the damper may be adjusted accordingly. The damper may be adjusted manually. Additionally or alternatively, the damper may include a control unit in communication with the pressure sensor whereby the damper is adjusted automatically based on a reading of the pressure sensor.

As explained, the pressure gradient may be positive above the zero point C in channel 160 and negative below the zero point C. The pressure below the sub-floor 120 may be lower than the pressure above the sub-floor. In one example, the pressure below the sub-floor 120 may be negative while the pressure above the sub-floor may be positive. The negative air pressure beneath the sub-floor 120 may aid in creating the pressure gradient within the channel 160. Thus, as the air pressure decreases (e.g. from above the zero point C to below the zero point C), the acceleration of the air movement increases. The warm air in the channel 160 moves from the top of the channel 160 to the bottom of the channel 160. Because the difference in pressure gradient across the channel 160 increases the acceleration of air towards the bottom of the channel 160, less stress is placed on the fan as air is pulled from the channel 160 to the duct 185.

As explained above, the warm air within the channel 160 is pushed downward through the opening 190 into the duct 185. The sub-floor 120 may extend between the walls of the room, thus forming a duct 185 below the sub-floor 120. In this example, a negative pressure may be created below the sub-floor 120 when air is pulled from the duct 185 by a cooling unit 110. A slightly higher, positive air pressure may exist above the sub-floor. The negative pressure may, in turn, cause more air to be drawn into the duct 185. Because the duct 185 is sealed off from the rest of the room (e.g., via blanketing and/or floor grommets), the only air that may be drawn into the duct 185 is the warm air from the channel 160. Although the Figures illustrate a system wherein air is pushed downward beneath the sub-floor 120 at the first surface, the system 100 may also include air being pushed upwards into the ceiling at the second surface. In this example, the sub-floor may 120 may be ceiling tiles and a duct may be created above the ceiling tiles overhead of the cooling unit 110 and server rack 115.

FIG. 3 illustrates a back view of the exemplary server rack 115. As explained above, a plurality of media lines 152 may extend into the channel 160. Although the media lines 152 are shown as extending downward, the lines 152 may also extend upward, or to either side of the server rack.

Figure 4:
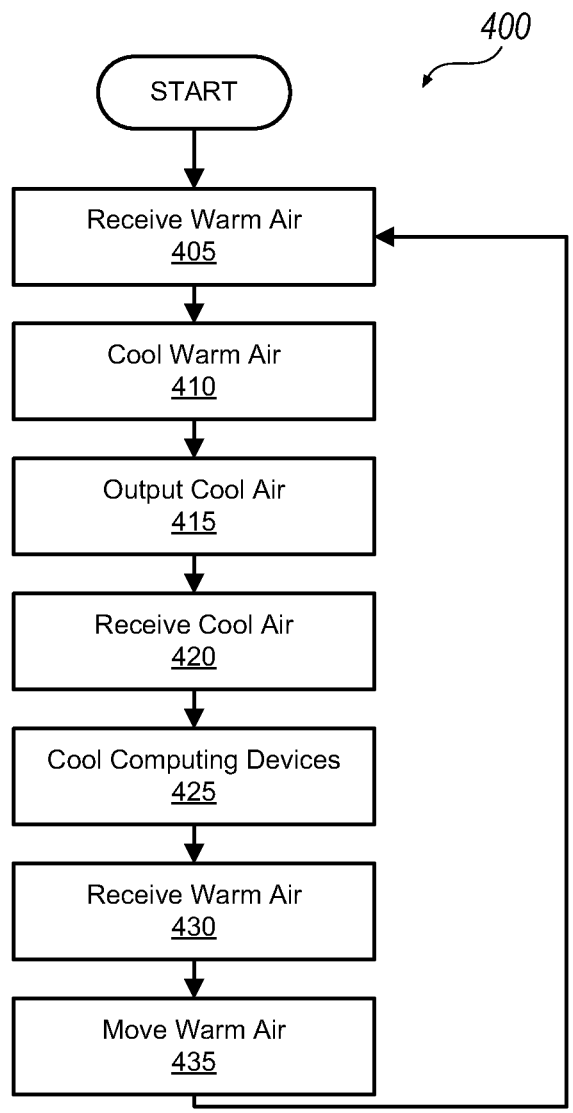
FIG. 4 is a flow chart of the system.

FIG. 4 shows an exemplary process for cooling the server rack 115. In operation, process 400 may begin at block 405 when the cooling unit 110 receives warm air from the duct 185 at the bottom of the cooling unit 110. In block 410, the cooling unit 110 then proceeds to cool the air received from the duct 185. In block 415, the cooling unit 110 may blow the cool air into the server room. The cool air may be blown out from the top of the cooling unit 110, such as is the case with traditional up-flow cooling units. The room, in turn, is cooled. In block 420, as the room receives cool air, so does the server rack front 125. The cool air received at the server rack front 125 is then passed over the heat generating devices 170 in the server rack 115 at block 425. As the heat generating devices 170 are cooled by the cool air, the cool air becomes warm air. At block 430, the warm air is then received by the channel 160. At block 435, the fan, damper, and negative pressure created in the duct 185 proceed to pull the warm air downward through the channel 160 into the duct 185. The warm air then proceeds to enter the cooling unit 110 via the duct 185 and the process 400 returns to block 405.

Thus, a system 100 for cooling a server rack 115 is described herein. The system 100 maintains a channel 160 and duct 185 for keeping the warm air separate from the cool air. This is accomplished, in part, by sealing off certain components and portions of the server rack, e.g., the channel 160, sides 135, back 180, and sub-floor 120. Also, the channel 160 may be formed between the backs 155 of the heat generating devices 170 and the server rack back 130. Because an existing rack 115 may be modified, this is an economical and efficient method of maintaining separate cool and warm air passages. The warm and cool air passages are fully contained using only a minimal amount of hardware. Additionally, the sealed sides 135 and back panel 180 may be added to the server rack 115 of an up-flow CRAH system, which are readily available and widely used. Further, the system 100 described herein does not interfere with existing fire suppression systems.

Moreover, the warm air may be extended underneath the floor 120 while the cool air from the cooling unit 110 is distributed within the room allowing the room to be maintained at a comfortable temperature. Additionally, because the warm air is pushed from the channel 160 down into the duct 185 by a slight difference in pressure gradient, particles within the room, (e.g., dust) are drawn downward into the floor tile. In an alternative system, the particles could be blown upward into the room, and thus into the server rack 115.

Reference in the specification to "one example," "an example," "one embodiment," or "an embodiment" means that a particular feature, structure, or characteristic described in connection with the example is included in at least one example. The phrase "in one example" in various places in the specification does not necessarily refer to the same example each time it appears.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

The invention claimed is:

1. A cooling system comprising:
   a cooling unit spaced from a server rack unit, the cooling unit configured to receive warm air from the server rack unit;
   the server rack unit having a first surface and a second surface opposite the first surface and being configured to receive cool air from the cooling unit at a server rack front, a server rack back opposite the server rack front connected by a pair of server rack sides;
   an obstruction formed between the server rack front and server rack back forming a channel between the obstruction and the server rack back for receiving warm air from the server rack unit, the first surface defining a server rack opening below the channel;
   a back panel sealed to the server rack back and a side panel sealed to each of the server rack sides;
   a sub-floor on which the server rack unit is mounted, the sub-floor defining a floor opening for receiving the warm air from the channel through the server rack opening, the floor opening being aligned with the server rack opening, and the server rack unit being sealed to the sub-floor via a single seal between the server rack opening and the floor opening; and a duct extending from the server rack opening to the cooling unit to duct the warm air from the channel to the cooling unit; and a damper disposed at the first surface, wherein a pressure gradient of the warm air in the channel is greater at the second surface than at the first surface, the pressure gradient creating an air flow forcing the warm air in the channel in to the server rack opening, and wherein the damper is configured to regulate the air flow inside of the channel, and is automatically regulated based on a static differential pressure between a location exterior to the server rack unit and a location within the channel.

2. The system of claim 1, wherein the channel includes a zero point having a pressure gradient of at least near zero.

3. The system of claim 1, wherein the server rack unit includes a plurality of racks, one next to each other such that there are two outermost racks each having an outermost side, wherein each of the pair of server rack sides form one of the outermost sides of the outermost racks.

4. The system of claim 1, wherein the back panel is sealed to each of the two side panels and the first and second surfaces of the server rack unit.

5. The system of claim 1, wherein at least a portion of the obstruction is formed by at least one device.

6. The system of claim 1, wherein the server rack unit includes a plurality of server rack units, one next to each other such that there are two outermost sides of the plurality of server rack units, wherein the two outermost sides of the plurality of server rack units are sealed with the side panels.

7. The system of claim 1, further comprising a room for housing at least one of the cooling unit and server rack unit, the room includes a plurality of walls and a room floor.

8. The system of claim 7, wherein the duct is defined by the room floor, the sub-floor and the room walls.

9. The system of claim 2, wherein the pressure gradient above the zero point is positive, and the pressure gradient below the zero point is negative.

10. The system of claim 2, wherein the zero point is located at approximately a center point of the channel.

11. A server rack unit comprising:

a first surface and a second surface opposite the first surface;

a server rack front and a server rack back opposite the server rack front, the server rack front and the server rack back being connected by a pair of server rack sides, the server rack front being configured to receive cool air from a cooling unit;

an obstruction formed between the server rack front and server rack back forming a channel between the obstruction and the server rack back for receiving warm air from the server rack unit, the first surface defining a server rack opening below the channel;

a back panel sealed to the server rack back and a side panel sealed to each of the server rack sides; and a damper disposed at the first surface;

wherein a pressure gradient of the warm air in the channel is greater at the second surface than at the first surface, the pressure gradient forcing the warm air into the server rack opening;

wherein the channel includes a zero point having a pressure gradient of near zero at an intermediate section along the channel; and wherein the damper is configured to regulate the warm air inside of the channel, and is automatically regulated based on a static differential pressure between a location exterior to the server rack unit and a location within the channel.

12. The server rack unit of claim 11, wherein the pressure gradient above the zero point is positive, and the pressure gradient below the zero point is negative.

13. The server rack unit of claim 11, wherein the zero point is located at approximately a center point of the channel.

* * * * *